United States Patent [19]

Herndon

[11] Patent Number: 4,857,772
[45] Date of Patent: Aug. 15, 1989

[54] BIPMOS DECODER CIRCUIT

[75] Inventor: William H. Herndon, Sunnyvale, Calif.

[73] Assignee: Fairchild Semiconductor Corporation, Cupertino, Calif.

[21] Appl. No.: 42,995

[22] Filed: Apr. 27, 1987

[51] Int. Cl.$^4$ .................. H03K 17/16; H03K 19/082; H03K 17/60
[52] U.S. Cl. .................... 307/463; 307/443; 307/446; 307/449; 307/570
[58] Field of Search ............... 307/463, 443, 446, 449, 307/570

[56] References Cited

U.S. PATENT DOCUMENTS

| | | | |
|---|---|---|---|
| 4,385,370 | 5/1983 | Isogai | 307/463 |
| 4,612,456 | 9/1986 | Vasseghi et al. | 307/446 |
| 4,612,458 | 9/1986 | Vasseghi et al. | 307/446 |
| 4,730,132 | 3/1988 | Watanabe et al. | 307/449 |

FOREIGN PATENT DOCUMENTS 2118357 7/1972 France .

Primary Examiner—Stanley D. Miller
Assistant Examiner—M. R. Wambach
Attorney, Agent, or Firm—Burns, Doane, Swecker & Mathis

[57] ABSTRACT

A decoder incorporates the advantageous features of both bipolar and BICMOS decoding circuits through the use of BIPMOS technology. PMOS gating transistors are used to control the operation of bipolar output transistors. It is only necessary to operate the PMOS transistors with relatively small drain voltage variations, since the bipolar transistors are sensitive to such small variations. Further, transient signals are referenced to one power supply voltage only, to thereby make the logic swing and performance characteristics of the decoder independent of power supply voltage variations. Therefore it becomes possible to use PMOS transistors that have smaller voltage requirements than conventional CMOS circuits.

27 Claims, 4 Drawing Sheets

BIPMOS DECODER CIRCUIT

BACKGROUND OF THE INVENTION

The present invention is directed to decoder circuits, and more particularly to a 1-of-N decoder that places a predetermined binary level signal on one of a multiplicity of output lines in response to a multibit input signal.

Decoders of this type are commonly used to address random access and read only memories. To address the cells in a particular row of the memory, a word line connected to all of the cells in that row is brought to a predetermined binary state, e.g., high. All of the other word lines connected to the remaining rows of cells of the memory remain in a binary low state, so that only the information stored in the selected row of cells will be sensed through bit lines connected to the respective columns of cells. The 1-of-N decoder serves to bring the selected word line to the binary high state in response to an address word from a control CPU or the like.

In the past, standard decoder circuits have generally fallen into one of two categories. One category of decoders is comprised of only bipolar transistors using emitter coupled logic. The other category of decoders employs field effect transistors. Decoders in this latter category can be comprised entirely of field effect transistors, e.g., CMOS circuit arrangements, or a combination of bipolar NPN transistors with both N- and P-channel MOS transistors, i.e., BICMOS circuits.

Each of the two categories of decoder circuits has its attendant advantages and limitations. For example, the decoders which use MOS devices have essentially no static power dissipation, since current is drawn only when switching from one state to another. In contrast, the ECL decoder draws a much more significant current even while it is in an idle state.

However, decoders which use BICMOS technology are more expensive to manufacture because they require more masking steps to provide each of the bipolar NPN transistors, PMOS and NMOS field effect transistors during the fabrication of the integrated circuit. In addition, they must be fed with standard CMOS voltage levels, which are higher than those needed in the strictly bipolar approach.

Another advantage which the ECL decoder attains over the known FET-based circuits pertains to the output signal reference levels. In the bipolar ECL approach, the binary level signals on the output lines are referenced only to a single power source voltage. For example, a logic high signal might be at or quite near the higher power source voltage, and logic low might be a predetermined voltage below the high level. In contrast, the logic signals that are produced with the MOS decoder circuits are a function of both the high and low power supply levels. In other words, the logic high signal follows the higher power source voltage (e.g., $V_{cc}$) and the logic low follows the ground reference voltage. A problem associated with this latter arrangement is that transient signals, i.e., logic swings, are dependent upon power supply noise and voltage variations.

BRIEF STATEMENT OF THE INVENTION

Accordingly, it is an object of the present invention to provide a novel decoder that incorporates the advantageous features of both bipolar and BICMOS decoding circuits without their individual attendant limitations noted above. In accordance with the present invention, this objective is achieved through the use of BIPMOS technology which includes both bipolar NPN and P-channel MOS transistors. Since this technology does not include N-channel transistors, fewer masking steps are required to produce the circuit, thereby resulting in a lower cost. However, the circuit retains almost all of the power saving advantages of conventional BICMOS decoders. In accordance with a further feature of the invention, transient signals are referenced to one power supply voltage only, to thereby make the logic swing and performance characteristics of the decoder independent of power supply voltage variations. Therefore it becomes possible to use PMOS transistors that have smaller voltage requirements than conventional CMOS circuits. In the arrangement of the present invention, the PMOS transistors are used to control the operation of the bipolar transistors. Accordingly, it is only necessary to operate the PMOS transistors with relatively small drain voltage variations, since the bipolar transistors are sensitive to such small variations.

Further features and advantages of the present invention are explained in detail hereinafter with reference to preferred embodiments illustrated in the accompanying drawings.

DESCRIPTION OF THE ILLUSTRATED EMBODIMENTS

Figure 1:
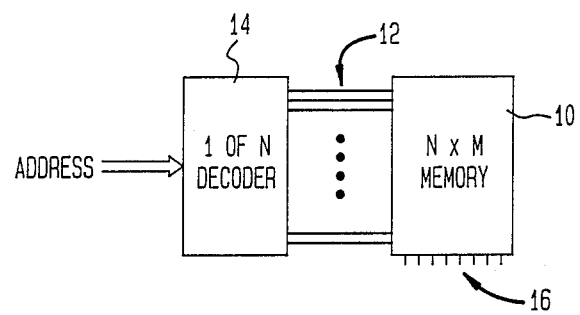
FIG. 1 is a block diagram of an exemplary circuit in which the decoder of the present invention can be utilized.

As briefly described above, 1-of-N decoders are commonly employed as memory control circuits. An application of such a decoder is illustrated in FIG. 1. In this example, the memory circuit 10 to be controlled is an N×M memory having N word lines 12 and M bits of information per Word. For example, the number of word lines, N, might be 256 and the number of bits per word, M, might be 32, to provide an 8K memory. This memory can be either a read/write random access memory (RAM) or a read only memory (ROM).

In operation, all of the word lines 12 are held at a preselected binary state, e.g., logic low, by a 1-of-256 decoder 14. When it is desired to read a particular 32-bit word of information, the address of that word is indicated by an 8-bit address signal applied to the decoder. The address signal causes the decoder to bring the signal on a selected word line to a logic high level while maintaining all of the other word lines at the logic low level. When the selected word line is brought to the logic high level, it becomes possible to sense the value of each of the 32 bits in the word associated with that word line by means of bit lines 16 in the memory.

In the following description of preferred embodiments of the present invention, reference is made to the use of the invention in a memory control environment of the type depicted in FIG. 1. Such reference is made for the purpose of facilitating an understanding of the inventive concepts and their applications. However, it will be appreciated by those having familiarity with the applicable art that 1-of-N decoder circuits can be used in other applications, and the illustrative reference to memory circuit control is not intended in any way to be a limitation on the invention or its applications.

Figure 2:
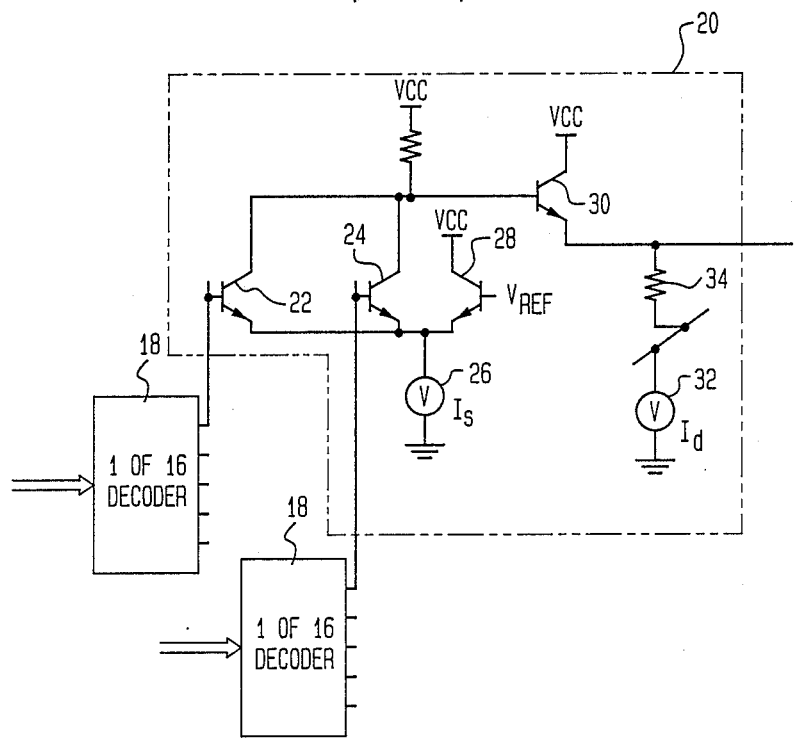
FIG. 2 is a schematic diagram of a prior art bipolar decoder circuit.

Referring now to FIG. 2, a prior art bipolar decoder circuit using emitter coupled logic is illustrated. In operation, an 8-bit address signal from a CPU or the like is divided into two 4-bit signals, each of which is fed to a 1-of-16 predecoder 18. In response to the applied input signals, each predecoder 18 causes one of its 16 output lines to go to a logic low level, while maintaining the other 15 output lines at a logic high level. One output line from each of the two 1-of-16 predecoders is fed to a gate 20, only one of which is shown in FIG. 2. In practice 256 (i.e., 16×16) gates are employed, with each having a different combination of inputs from the two respective predecoders 18.

In each gate 20, the pair of input lines from the 1-of-16 predecoders are respectively connected to the bases of two NPN transistors 22 and 24 connected in parallel to form a NOR gate. The collectors of these two transistors are connected to a positive power supply voltage $V_{cc}$ by means of a pull-up resistor 25, and the emitters of these two transistors are connected to a current sink 26, e.g., a ground reference potential. Another NPN transistor 28 is connected to the transistors 22 and 24 by means of a common emitter configuration to form a difference amplifier. A suitable reference voltage is applied to the base of the transistor 28. This voltage reference might be at about the midpoint of the logic high and logic low voltage levels produced on the output lines of the 1-of-16 decoders 18. In operation, the 1-of-16 predecoders normally hold the bases of the transistors 22 and 24 at a logic high level, so that these transistors are conductive. In this case, a current $I_s$ is conducted through these transistors. When both of the input lines to the gate 20 are brought low by the predecoders, the transistor 28 becomes conductive to carry the current $I_s$.

The collectors of the transistors 22 and 24 are also connected to the base of an emitter follower transistor 30. The collector of this transistor is connected to the positive power supply voltage $V_{cc}$ and its emitter is connected to a current sink 32 by means of a pull-down resistor 34. The current sink 32 is connected in common with a corresponding emitter follower transistor in each of the other 255 gates in a similar manner by means of respective pull-down resistors. The junction between the emitter of the transistor 30 and the pull-down resistor 34 is connected to an associated word line of the memory unit.

In operation, when either of the transistors 22 or 24 is conductive, it causes the current $I_s$ to be conducted through its collector and the pull-down resistor 25, thereby holding the base of the transistor 30 at a low voltage level. Consequently, this transistor is maintained in a non-conductive state, and the associated word line is at a logic low level. Upon coincidence of a low signal at each of the two input lines from the predecoders, the resistor 25 supplies current to the base of the transistor 30 to render it conductive. This causes the signal on the associated word line to go high. At this time, the current $I_s$ is steered through the transistor 28.

It will be appreciated that the total current required by a 1-of-256 decoder of the type represented in FIG. 2 is equal to 256 $I_s+I_d$ since each of the gates draws a current $I_s$ regardless of its state of actuation, and the selected gate also draws a current $I_d$ through its pull-down resistor 34. These substantial power requirements impose a serious limitation on the speed of the decoder. More particularly, if the number of gates is increased to accommodate a greater number of word lines, the time required to access each word address increases if a constant power is supplied. In order to decrease access time it becomes necessary to increase the power that is available to the decoder.

Figure 3:
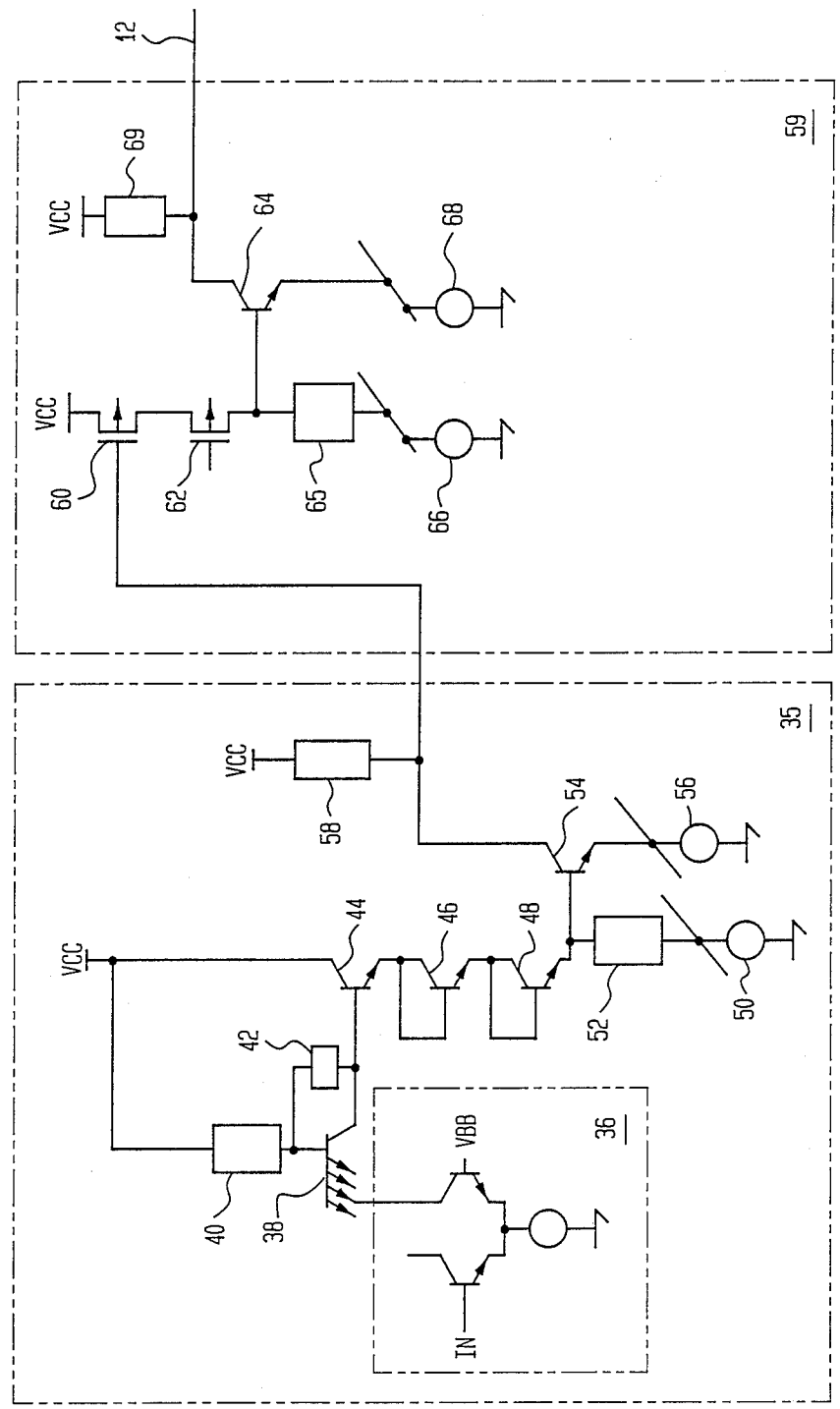
FIG. 3 is a schematic diagram of one embodiment of a decoder which incorporates the present invention.

In accordance with the present invention, the power requirements of a 1-of-N type decoder can be significantly reduced by utilizing a combination of bipolar and P-channel MOS devices. One example of a decoder circuit which achieves this objective is illustrated in FIG. 3. Because of its reduced power requirements, an increase in the number of word lines will have a minimal impact on the operating speed of the decoder.

Referring to FIG. 3, 4 bits of the address signal are respectively applied to 4 input buffers 36 in a 1-of-16 predecoder 35. Only one of these buffers is shown in the figure. The input buffer essentially comprises a common emitter difference circuit in which the base of one transistor receives a bit of the input signal and the base of the other transistor is connected to a suitable reference voltage. The collector of one of these two transistors is connected to an emitter of a multiple emitter transistor 38. The other emitters of this transistor are connected to similar buffer circuits in a known manner to form a logic selection circuit corresponding to the address of one of 16 possible output lines. The base of the multiple emitter transistor 38 is connected to the positive power supply voltage $V_{cc}$ by means of a first resistor 40, and also connected to its collector by means of a second resistor 42. In turn, the collector is connected to the base of a first transistor in a series of emitter follower and level shifting transistors 44, 46 and 48. The emitter of this last transistor is connected to a current sink 50 by way of a pull-down resistor 52 and also to the base of a switching transistor 54. The emitter of the switching transistor 54 is connected to a second current sink 56, and its collector is connected to the positive power supply voltage $V_{cc}$ through a pull-up resistor 58. The collector is also connected to an output line which comprises one of the 16 output lines of the predecoder.

Each predecoder comprises 16 circuits of the type depicted in FIG. 3. However, the current sources 50 and 56 are connected in common to each of the resistors and transistors corresponding to the pull-down resistor 52 and output transistor 54, respectively, of the 16 circuits.

In operation, any 4-bit input signal will correspond to the logical arrangement of the input buffers and multi-emitter transistor 38 of one of the 16 selection circuits, causing its multi-emitter transistor to turn off. When this occurs, the level shifting transistor 44 and the diode-connected transistors, 46, 48 are each rendered conductive to present a relatively positive voltage at the emitter of the final transistor 48. The current sink 50 will therefore conduct current for the selected one, and only the selected one, of the 16 possible paths. This current will render the switching transistor 54 conductive to bring the output line associated with this transistor to a logic low level. Preferably, the value of the pull-up resistor 58 is chosen so that the voltage drop that is achieved across this resistor is less than the level shift produced by the transistors 44-48. With this arrangement, saturation of the switching transistor 54 is avoided, to achieve faster response times.

In an associated gate 59, a pair of input lines from two 1-of-16 predecoders 35 are respectively applied to the gate electrodes of a pair of P-channel MOS transistors 60 and 62 having their drain-source current paths connected in series between the positive power supply voltage $V_{cc}$ and the base of a bipolar NPN switching transistor 64. The P-channel transistors 60 and 62 are also connected, by means of a pull-down resistor 65, to a current sink 66 that is common to all of the 256 gates. The emitter of the switching transistor 64 is connected to a second current sink 68 that is likewise common to all of the gates. The collector of the switching transistor is connected to an output word line 12 and to the positive power supply voltage by means of a pull-up resistor 69.

In operation, the switching transistor 64 of one of the gates 59 is selected by the coincidence of a negative voltage at the gate electrode of each of its two associated P-channel transistors 60 and 62. When the switching transistor 64 is actuated, it pulls the associated word line low. Almost all of the common current for the decoder is fed into the selected word line because the base voltage of the switching transistor 64 is more positive than that of the other transistors which share the same emitter current sink 68. For example, at room temperature, a 204 mv difference between the most positive base and the other bases will cause 90% of the common current of the current sink 68 to flow through the selected switching transistor 64, leaving the other 10% to be shared by the 255 unselected gates. Since most of the power flows through the selected gate, the power dissipation of the circuit is constant and no large transients occur during switching.

Furthermore, the output signals of the decoder, i.e., the logic high and low levels, are referenced only to the $V_{cc}$ power supply. Thus, logic swings are substantially independent of power supply noise and voltage variations.

In the circuit illustrated in FIG. 3, the logical "AND" function for detecting the coincidence of two low level input signals is performed by the series connected P-channel transistors 60 and 62. In some cases, it may be preferable to have this logical function accomplished using bipolar logic. Such an arrangement is illustrated in a second embodiment of the invention shown in FIG. 4. In this embodiment, each of the 1-of-16 predecoders 35 can have the same structure as those shown in FIG. 3. However, the switching transistor 54 and second current sink 56 can be eliminated so that the emitter of the level shifting transistor 48 is directly connected to the output line of the predecoder to provide a logic high selection signal.

Figure 4:
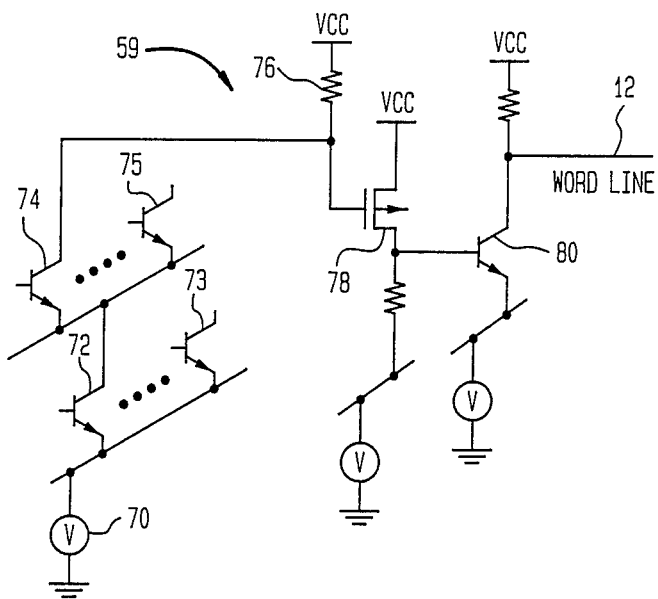
FIG. 4 is a schematic diagram of a second embodiment of a decoder gate according to the present invention.

In the gate circuit shown in FIG. 4, a single current through a sink 70 is steered into 1 of 256 possible paths through two tiers of current switches. The first tier is formed by bipolar NPN transistors 72-73 each having its base connected to a separate output line of one of the 1-of-16 predecoders 35. Since only one of these transistors will be activated by the selected high output signal from the predecoder, it will steer the current to one of 16 second tiers. Each of these second tiers comprises 16 bipolar transistors whose bases are respectively connected to the 16 output lines of the second predecoder. The collector of each of these second tier transistors is connected to a separate word line by means of a circuit such as that shown in FIG. 4. When the first tier transistor 72 and the second tier transistor 74 associated with a particular word line are both actuated, they develop a voltage across a pull-up resistor 76 to render conductive a P-channel MOS transistor 78 (which corresponds to one of the MOS transistors 60 and 62 of the first embodiment). The value of the resistor 76 is preferably chosen so that the second tier transistor 74 does not saturate when it is actuated. In response to the conduction of the PMOS transistor 78, a bipolar NPN transistor 80 is actuated in the same manner as the switching transistor 64 of the first embodiment.

Figure 5:
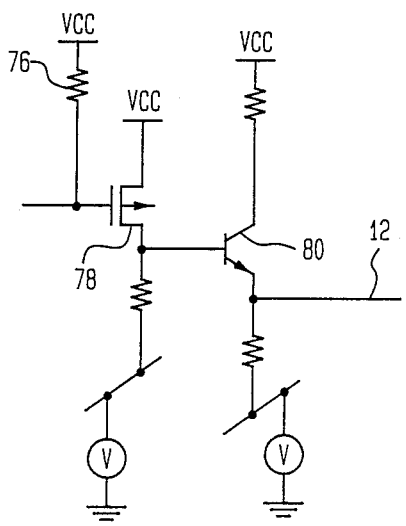
FIG. 5 is a schematic diagram of a variation of the embodiment shown in FIG. 4.
Figure 6A:
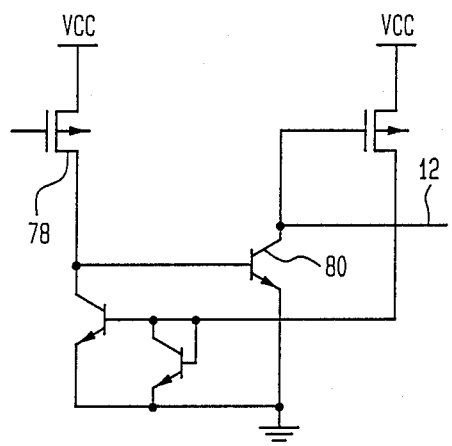
FIGS. 6A-6D are schematic circuit diagrams of other variations of the second embodiment of the invention.
Figure 6B:
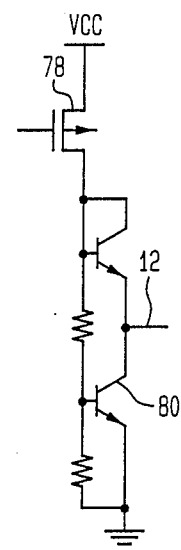
Figure 6C:
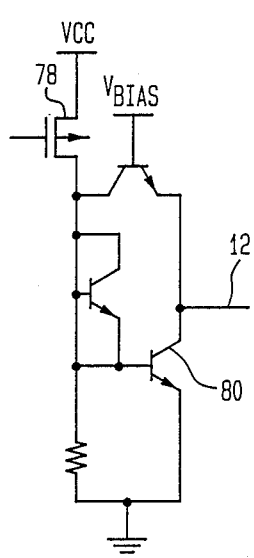
Figure 6D:
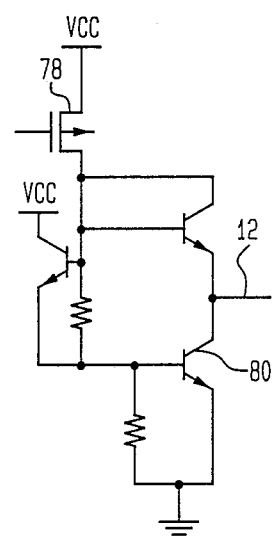

The preceding embodiments of the invention have been illustrated for the case in which the selected word line is pulled to a logic low level to access the information in the memory. However, the invention is equally applicable to situations in which the word lines are normally held in a low state and the selected line is pulled to a logic high level. One example of a circuit for operating in this mode is illustrated in FIG. 5. All of the components of the decoder are essentially the same as in the embodiment of FIG. 4, except for the connections of the switching transistor 80. In this regard, the collector of the transistor is directly connected to the positive power supply voltage $V_{cc}$, and its emitter is connected to the output word line 12 to provide an emitter follower arrangement. The emitter is also connected to the common current sink 81 by means of a pull-down resistor 82.

Similar to the considerations for the transistors 54 and 74 in the predecoder circuits of FIGS. 3 and 4, respectively, performance of the decoder is improved by limiting the current flowing through its output transistor (64 or 80) to prevent saturation. This current limiting can be done through appropriate selection of the pull-up or pull-down resistor connected to the collector or emitter, respectively, of this transistor. Alternatively, saturation can be prevented by suitable clamping and feedback techniques. Examples of these techniques are illustrated in FIGS. 6A-6D.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. 1-of-$N^2$ decoder having $N^2$ output lines each of which carries a binary logic signal with a value that is referenced to only a single power source voltage, comprising:

a pair of 1-of-N predecoders each having N control lines and being responsive to an input signal to produce a signal at one binary voltage level on one of said control lines and a signal at a complementary binary level on the other $N-1$ control lines;

$N_2$ p-channel MOS transistors each having a drain-source current path connected between said power source voltage and a current sink commonly connected to all of said MOS transistors through respective loads;

$N^2$ bipolar NPN transistors each having a collector connected to said power source voltage and an emitter connected to a current sink common to all of said bipolar transistors, the collector-emitter paths of said bipolar transistors being respectively connected to said $N^2$ output lines, each of said bipolar transistors having a base that is connected to the drain-source current path of a respective one of said MOS transistors; and logic selection means connected to the gates of said MOS transistors and responsive to the binary signals on the control lines of said predecoders to cause one of said MOS transistors to conduct current along its drain-source current path and thereby actuate the bipolar transistor connected to said one MOS transistor so that said bipolar transistor conducts current and produces on the associated output line a binary signal having a predetermined voltage relative to said power source voltage.

2. The decoder of claim 1 wherein each predecoder comprises an input terminal for receiving a plural bit input signal, N selection gates each being logically connected to said input terminal such that only one of said gates is in a predetermined state at any time in response to the bits in said input signal, N level shifting circuits each including at least one bipolar transistor having a collector connected to a power supply voltage and being responsive to the state of a respective selection gate to produce an output voltage at an output emitter wherein said N control lines respectively produce output signals related to the output voltages at said output emitters of said level shifting circuits.

3. The decoder of claim 2 wherein each level shifting circuit includes plural diode-connected transistors connected in series between said bipolar transistor and said output lines.

4. The decoder of claim 2 further including a bipolar switching transistor having a base electrode receiving said output voltage of a level shifting circuit and a collector connected to an associated control line, and a pull-up resistor connected between said collector of said switching transistor and said power supply voltage.

5. The decoder of claim 4 wherein said pull-up resistor has a value such that the voltage at the collector of said switching transistor is greater than the voltage at the base of said switching transistor when the associated selection gate is in said predetermined state, to thereby prevent saturation of said switching transistor.

6. The decoder of claim 1 wherein said logic selection means includes a second P-channel MOS transistor in series with each of said $N_2$ MOS transistors, wherein a gate electrode of one of said series-connected MOS transistors is connected to a control line of one of said predecoders and the gate electrode of the other series connected MOS transistor is connected to a control line of the other predecoder.

7. The decoder of claim 1 wherein said logic selection means includes:

a first tier of bipolar transistors having their emitters connected in common to a current source and each having a base electrode which receives a different respective binary signal from one of said predecoders, and a plurality of second tiers of bipolar transistors each comprising plural bipolar transistors having their emitters connected in common to the collector of a respective one of the transistors in said first tier, the transistors in each of said second tier having base electrodes which receive respective binary signals from the other of said predecoders and collector electrodes which are connected to respective ones of said MOS transistors.

8. A 1-of-$N^2$ BIPMOS decoder circuit comprising:

a predecoding circuit which receives an input signal and produces a logic output signal designating one of N possible output conditions indicated by said input signal;

N decoding gates respectively producing said N output conditions, each of said decoding gates including:

at least one p-channel MOS transistor having a gate electrode for receiving a binary logic signal resulting from the logic output signal of said predecoding circuit, a bipolar output transistor having a base electrode connected to a drain of said MOS transistor such that said bipolar output transistor is rendered selectively conductive in response to the state of the binary logic signal at the gate electrode of said MOS transistor, an output terminal connected to one of the collector and emitter of said bipolar transistor, and a current sink connected in common to the drain of the MOS transistor in each of said N gates.

9. The decoder circuit of claim 8 wherein said decoding gate includes two p-channel MOS transistors having their source-drain current paths connected in series, with the source electrode of one of said MOS transistors being connected to a power supply voltage and the drain electrode of the other MOS transistor being connected to the base electrode of said bipolar output transistor.

10. The decoder circuit of claim 9 wherein each of said two MOS transistors has a gate electrode which receives a binary level logic signal from said predecoding circuit.

11. The decoder circuit of claim 9 wherein the collector of said bipolar output transistor is connected to said power supply voltage by means of a pull-up transistor, and said output terminal is connected to said collector.

12. The decoder circuit of claim 9 wherein the collector of said bipolar output transistor is directly connected to said power supply voltage, and said output terminal is connected to the emitter of said output transistor in an emitter follower relationship.

13. The decoder circuit of claim 8 further including a current sink connected in common to the emitter of the bipolar output transistor in each of said N gates.

14. The decoder circuit of claim 8 further including:

a first tier of bipolar transistors having their emitters connected in common to a current source and each having a base electrode which receives a different respective binary signal from said predecoding circuit, and a plurality of second tiers of bipolar transistors each comprising plural bipolar transistors having their emitters connected in common to the collector of a respective one of the transistors in said first tier, the transistors in each of said second tier having base electrodes which receive respective binary signals from said predecoding circuit and collector electrodes which are connected to the MOS transistor of respective ones of said N decoding gates.

15. The decoder circuit of claim 14 wherein all of said bipolar transistors are NPN transistors.

16. The decoder circuit of claim 8 wherein said predecoding circuit comprises K predecoders each having $N^{1/K}$ output lines, each predecoder receiving said input signal and being responsive thereto to produce a first predetermined voltage on one of said output lines and a second predetermined voltage on the other $N^{1/K}-1$ output lines.

17. The decoder of claim 16 wherein each predecoder comprises an input terminal for receiving a plural bit input signal, multiple selection gates each being logically connected to said input terminal such that only one of said gates is in a predetermined state at any time in response to the bits in said input signal, multiple level shifting circuits each including at least one bipolar transistor having a collector connected to a power supply voltage and being responsive to the state of a respective selection gate to produce an output voltage at an output emitter and multiple lines respectively producing output signals related to the output voltages at said output emitters of said level shifting circuits.

18. The decoder circuit of claim 17 wherein each level shifting circuit includes plural diode-connected transistors connected in series between said bipolar transistor and said output lines.

19. The decoder circuit of claim 17 further including a bipolar switching transistor having a base electrode receiving said output voltage of a level shifting circuit and a collector connected to an associated output line, and a pull-up resistor connected between said collector of said switching transistor and said power supply voltage.

20. The decoder circuit of claim 19 wherein said pull-up resistor has a value such that the voltage at the collector of said switching transistor is greater than the voltage at the base of said switching transistor when the associated selection gate is in said predetermined state, to thereby prevent saturation of said switching transistor.

21. A decoder circuit comprising:
a first plurality of predecoding means;
a second plurality of MOS logic gates, each fabricated using a single MOS process and comprising at least a first plurality of MOS transistors, receiving a first plurality of signals one from each said predecoding means, each said gate being connected to a first current sink, only one of said gates drawing a conduction-level current at any given time; and
a second plurality of bipolar transistor drives, each receiving a signal from a different one of said gates and driving a separate output line in dependence thereon, each said transistor being connected to a second current sink, only one of said transistors drawing an appreciable current at any given time.

22. The decoder circuit of claim 21 in which said decoder circuit is monolithically integrated.

23. The decoder circuit of claim 22 in which said MOS process is PMOS.

24. The decoder circuit of claim 23, in which said output lines are referenced to a single voltage reference.

25. The decoder circuit of claim 24 in which the collector of each said driver is connected to said single voltage reference, through a resistance, and to said output line.

26. The decoder circuit of claim 25 in which said first plurality of MOS transistors are connected in series with one another.

27. The decoder circuit of claim 26 in which said MOS transistors have a channel width less than that required to drive another MOS transistor.

* * * * *